US009361902B2

(12) United States Patent
Asada et al.

(10) Patent No.: US 9,361,902 B2
(45) Date of Patent: Jun. 7, 2016

(54) EARHOLE-WEARABLE SOUND COLLECTION DEVICE, SIGNAL PROCESSING DEVICE, AND SOUND COLLECTION METHOD

(71) Applicant: Sony Corporation, Tokyo (JP)

(72) Inventors: Kohei Asada, Kanagawa (JP); Koji Nageno, Tokyo (JP); Shinpei Tsuchiya, Tokyo (JP); Naotaka Tsunoda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 69 days.

(21) Appl. No.: 14/360,959

(22) PCT Filed: Nov. 30, 2012

(86) PCT No.: PCT/JP2012/081055
§ 371 (c)(1),
(2) Date: May 28, 2014

(87) PCT Pub. No.: WO2013/084811
PCT Pub. Date: Jun. 13, 2013

(65) Prior Publication Data
US 2014/0307884 A1 Oct. 16, 2014

(30) Foreign Application Priority Data
Dec. 8, 2011 (JP) ................................ 2011-268781

(51) Int. Cl.
*H03B 29/00* (2006.01)
*G10K 11/16* (2006.01)
(Continued)

(52) U.S. Cl.
CPC .......... *G10L 21/0208* (2013.01); *G10K 11/175* (2013.01); *G10K 11/178* (2013.01); *H04R 1/1083* (2013.01); *G10K 2210/1081* (2013.01); *G10K 2210/3026* (2013.01);
(Continued)

(58) Field of Classification Search
None
See application file for complete search history.

(56) References Cited

U.S. PATENT DOCUMENTS

2009/0147982 A1 6/2009 Ashida et al.
2011/0096939 A1 * 4/2011 Ichimura .............. H04R 1/1083 381/74

(Continued)

FOREIGN PATENT DOCUMENTS

JP 08-079873 A 3/1996
JP 2009-141698 A 6/2009

(Continued)

*Primary Examiner* — Regina N Holder
(74) *Attorney, Agent, or Firm* — Chip Law Group

(57) ABSTRACT

The present technique relates to an earhole-wearable sound collection device, a signal processing device, and a sound collection method for realizing sound collection at a high S/N ratio with reduced noise influence, regardless of noise reduction methods such as the SS method.

In the earhole-wearable sound collection device, a microphone that collects emitted speech voice is provided in a space that is substantially sealed off from outside and connects to an ear canal of the wearer, so that emitted speech voice propagating through the ear canal of the wearer is collected. A noise cancelling unit that reduces noise propagating in the internal space having the microphone located therein is further provided to improve the S/N ratio of emitted speech voice collection signals. Further, an equalizing process for reducing the muffled sound generated when the emitted speech voice propagating through the ear canal is collected is performed on the sound collection signal from the microphone. In this manner, higher sound quality is achieved.

15 Claims, 13 Drawing Sheets

FIRST EMBODIMENT

(51) Int. Cl.

| | |
|---|---|
| ***G10L 21/0208*** | (2013.01) |
| ***G10K 11/178*** | (2006.01) |
| ***G10K 11/175*** | (2006.01) |
| *H04R 3/00* | (2006.01) |
| *H04R 1/10* | (2006.01) |
| *H04R 5/033* | (2006.01) |
| *H04R 5/04* | (2006.01) |

(52) U.S. Cl.
CPC ..... *G10K 2210/3027* (2013.01); *H04R 1/1016* (2013.01); *H04R 3/00* (2013.01); *H04R 5/033* (2013.01); *H04R 5/04* (2013.01)

(56) References Cited

U.S. PATENT DOCUMENTS

2012/0014532 A1* 1/2012 Kimura ................ H04R 1/1083 381/71.6
2012/0209601 A1* 8/2012 Jing .................... G10L 21/0364 704/226

FOREIGN PATENT DOCUMENTS

JP 4352932 B2 8/2009
JP 2010-147982 A 7/2010

* cited by examiner

EARHOLE-WEARABLE SOUND COLLECTION DEVICE, SIGNAL PROCESSING DEVICE, AND SOUND COLLECTION METHOD

TECHNICAL FIELD

The present technique relates to an earhole-wearable sound collection device that includes an attachment unit designed to have at least a portion to be inserted into an earhole portion, a signal processing device that performs signal processing on a sound collection signal generated by an internal microphone located in the attached unit, and a sound collection method.

CITATION LIST

Patent Document

Patent Document 1: Japanese Patent Publication No. 4,352, 932

BACKGROUND ART

In recent years, information processing devices having verbal communication functions, such as so-called smartphones, have started spreading widely.

In an information processing device having such a verbal communication function, an earpiece microphone (an earphone integrated with a microphone) that enables hearing of received speech voice and collection of emitted speech voice is employed.

FIG. 13 shows an example of a general earpiece microphone that is currently spread (hereinafter referred to as the conventional earpiece microphone 100).

As shown in FIG. 13, in the conventional earpiece microphone 100, an earphone unit 101 for listening to received speech voice and a microphone 102A for collecting emitted speech voice are provided separately from each other. The earphone unit 101 is designed to be wearable in an ear of a wearer H, and includes a speaker for outputting received speech voice. In this earpiece microphone 100, an on-cord housing 102 is formed on the cord for transmitting signals to the earphone unit 101, and the microphone 102A is formed in this on-cord housing 102.

In the conventional earpiece microphone 100 having the above structure, speech voice emitted from the wearer (the speaker) reaches the microphone 102A via the outside (the external air), and is then collected.

SUMMARY OF THE INVENTION

Problems to be Solved by the Invention

In the conventional earpiece microphone 100 having the above structure, the microphone 102A for collecting emitted speech voice is exposed to the outside. That is, the microphone 102A is in direct contact with extraneous noise (environmental noise).

Therefore, with the conventional earpiece microphone 100, a relatively large amount of ambient noise is collected together with emitted speech voice, and the S/N ratio (signal-to-noise ratio) of emitted speech signals tends to become lower. As a result, it becomes difficult for the person at the other end of the line to hear the speech voice emitted from the wearer H.

To suppress the S/N ratio degradation due to noise, it is possible to perform a so-called noise reduction process according to the SS (Spectrum Subtraction) method, for example.

However, a relatively large processing resource is required for performing such a noise reduction process, resulting in disadvantages in terms of product cost, power consumption, and the like.

Also, the noise reduction process involving nonlinear processing on the frequency axis according to the above mentioned SS method or the like normally has a problem of sound quality degradation after the processing.

The present technique has been developed in view of the above problems, and aims to realize sound collection with a high S/N ratio by reducing noise influence without the noise reduction process.

Solutions to Problems

To solve the above problems, an earhole-wearable sound collection device according to the present technique has the following structure.

Specifically, the earhole-wearable sound collection device includes an attachment unit that is designed so that at least part of the attachment unit can be inserted into an earhole portion, and is designed to form a substantially sealed internal space therein when attached to the earhole portion, the internal space connecting to an ear canal.

The earhole-wearable sound collection device also includes an internal microphone that is located in the internal space of the attachment unit, and collects emitted speech voice that is emitted by the wearer and propagates through the ear canal when the attachment unit is attached to the earhole portion.

The earhole-wearable sound collection device also includes an equalizing unit that performs an equalizing process of a high-frequency emphasizing type on a sound collection signal from the internal microphone.

The earhole-wearable sound collection device also includes a speaker that is located in the internal space of the attachment unit.

The earhole-wearable sound collection device also includes a noise cancelling unit that causes the speaker to output noise cancelling sound based on a sound collection signal from a microphone provided for the attachment unit, the noise cancelling sound being output to reduce noise that propagates in the internal space of the attachment unit.

According to the present technique, a microphone (the internal microphone) that collects emitted speech voice is located in a space that is substantially sealed off from outside and connects to an ear canal of the wearer (the speaker). As the microphone is located in a space sealed off from outside, influence of noise can be effectively reduced. As emitted speech voice that propagates through the ear canal of the speaker, the emitted speech voice can be collected at a higher S/N ratio than that in a case where a conventional earpiece microphone (FIG. 13) is provided to collect speech voice that is emitted from the wearer and propagates in the external air.

According to the present technique, the noise cancelling unit is further provided to reduce the noise that propagates in the internal space having the internal microphone located therein. Accordingly, the S/N ratio of emitted speech voice collection signals is further improved.

As will be apparent from the description below, the equalizing unit is provided only to reduce muffled sound that is generated when emitted speech voice propagating through an ear canal is collected.

Effects of the Invention

As described above, according to the present technique, emitted speech voice can be collected at a higher S/N ratio than that with a conventional earpiece microphone that collects emitted speech voice propagating through the external air.

Also, according to the present technique, the noise reduction process for sound collection signals is unnecessary. As a result, an increase in the signal processing resource can be prevented, and advantages can be achieved in terms of production cost and power consumption.

MODE FOR CARRYING OUT THE INVENTION

The following is a description of embodiments according to the present technique.

Explanation will be made in the following order.

<1. Collection of Speech Voice via an Ear Canal>

<2. Signal Processing for Sound Quality Improvement>

<3. Further S/N Ratio Improvement by Noise Cancelling in the Internal Space>

[3-1. First Embodiment]

[3-2. Second Embodiment]

[3-3. Third Embodiment]

[3-4. Fourth Embodiment]

[3-5. Fifth Embodiment]

<4. Modifications>

<1. Collection of Speech Voice Via an Ear Canal>

Figure 1:
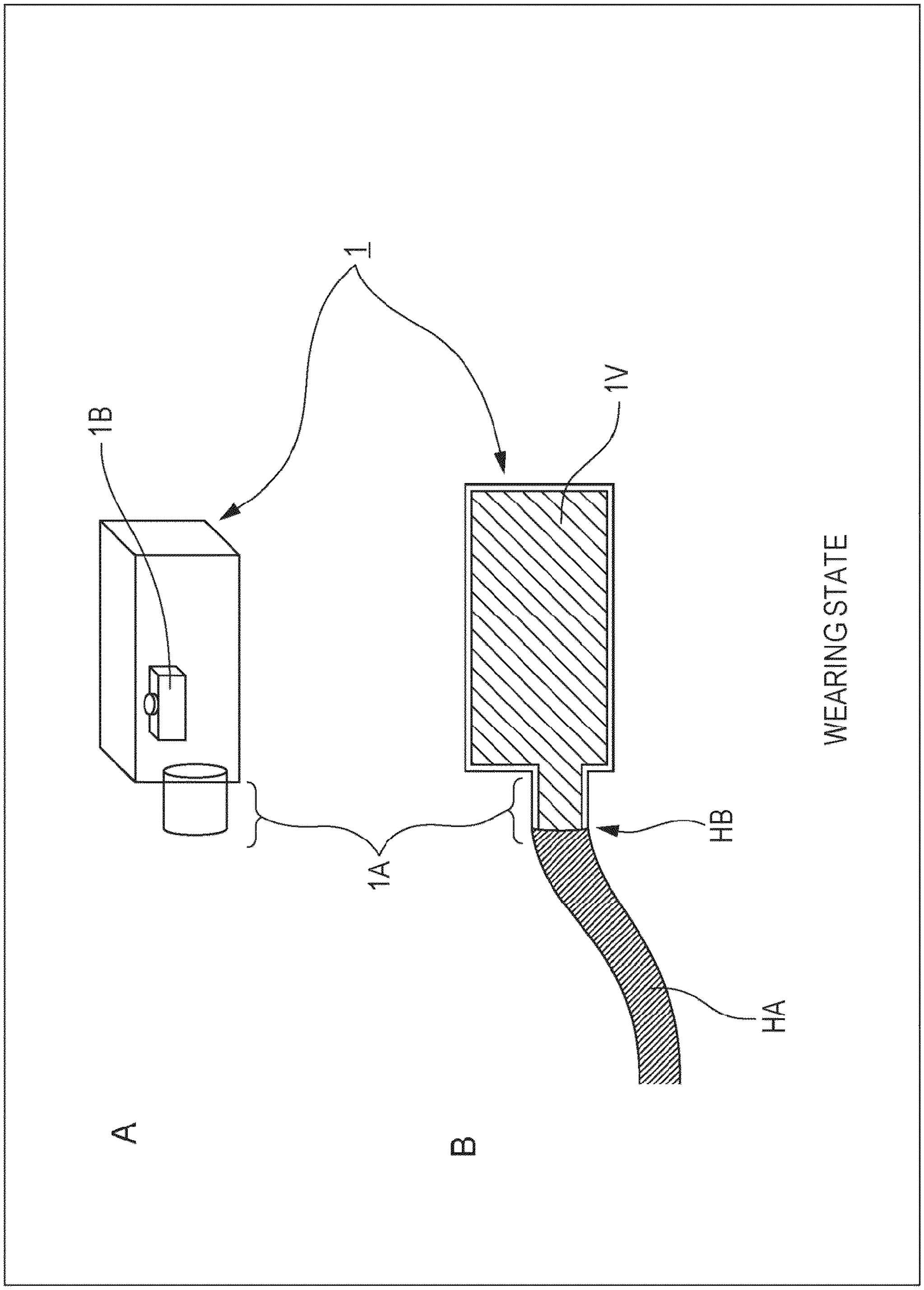
FIG. 1 is a diagram for explaining the structure of an attachment unit in a sound collection system of an embodiment.

FIG. 1 is a diagram for explaining the structure of an attachment unit 1 included in a sound collection system as an embodiment according to the present technique.

Specifically, A of FIG. 1 is a perspective view of the attachment unit 1, and B of FIG. 1 is a cross-sectional view showing the relations between an ear canal HA and an earhole portion HB of the wearer H and the attachment unit 1 when the attachment unit 1 is attached to an ear of the wearer (the speaker) H.

First, the attachment unit 1 has an internal microphone 1B provided therein to collect speech voice of the wearer (the speaker) H.

In this example, the internal microphone 1B may be a MEMS (Micro Electro Mechanical Systems) microphone, with the installation space being taken into account.

The external shape of the attachment unit 1 is designed so that at least part of the attachment unit 1 can be inserted into an earhole portion of the wearer H, and accordingly, the attachment unit 1 can be attached to an ear of the wearer H. Specifically, the attachment unit 1 in this case includes an earhole insertion portion 1A having such a shape that can be inserted into the earhole portion HB of the wearer H, and the earhole insertion portion 1A is inserted into the earhole portion HB, so that the attachment unit 1 is attached to the ear of the wearer H.

The attachment unit 1 is designed so that an internal space 1V connecting to the ear canal HA of the wearer H is formed as shown in B of FIG. 1 when the attachment unit 1 is attached to the wearer H.

At this point, the earhole insertion portion 1A of the attachment unit 1 is covered with a material having elasticity in its surface portion like the earhole insertion portion of a canal-type earphone portion, so that contact with the earhole portion HB is achieved at the time of attachment.

Accordingly, at the time of attachment, the above described internal space 1V becomes a space that is substantially sealed off from the outside.

The internal microphone 1B is provided in this internal space 1V.

Figure 2:
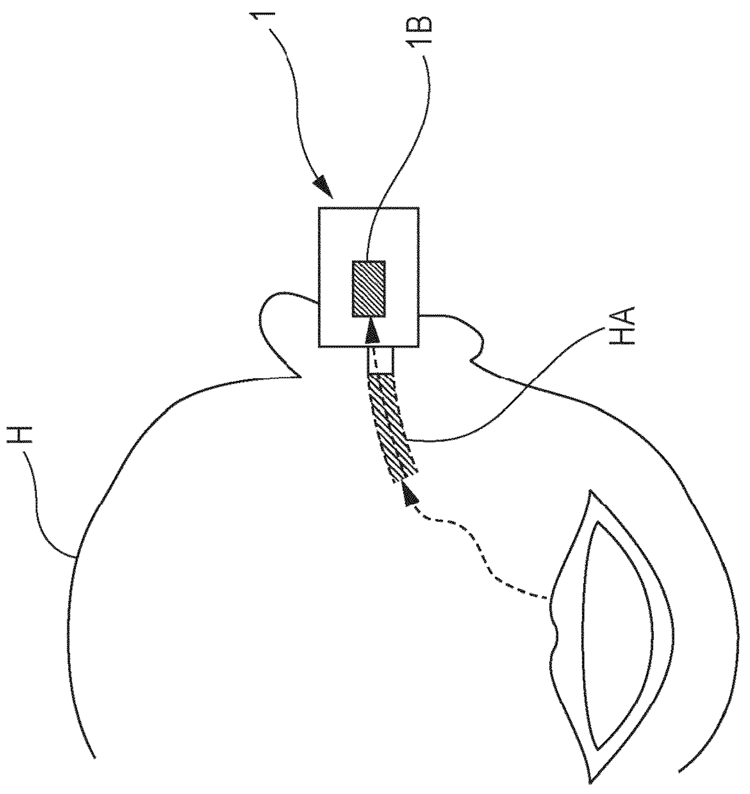
FIG. 2 is a diagram schematically showing collection of emitted speech voice by a sound collection system of an embodiment.

FIG. 2 is a diagram schematically showing collection of speech voice by the sound collection system of an embodiment including the attachment unit 1.

First, the sound collection system of this embodiment is based on the premise that collection of speech voice is performed while the attachment unit 1 is attached to an ear of the wearer H.

When the wearer H speaks while the attachment unit 1 is in an attached state, the vibrations accompanying the speaking are transmitted to the ear canal HA from the vocal cords of the wearer H via bones and the skin (as indicated by an arrow with a dashed line). As explained above with reference to FIG. 1, in the attached state, the internal space 1V of the attachment unit 1 having the internal microphone 1B provided therein connects to the ear canal HA, while being substantially sealed off from the outside. Accordingly, the speech voice obtained via the ear canal HA of the wearer H as described above can be collected by the internal microphone 1B.

Figure 13:
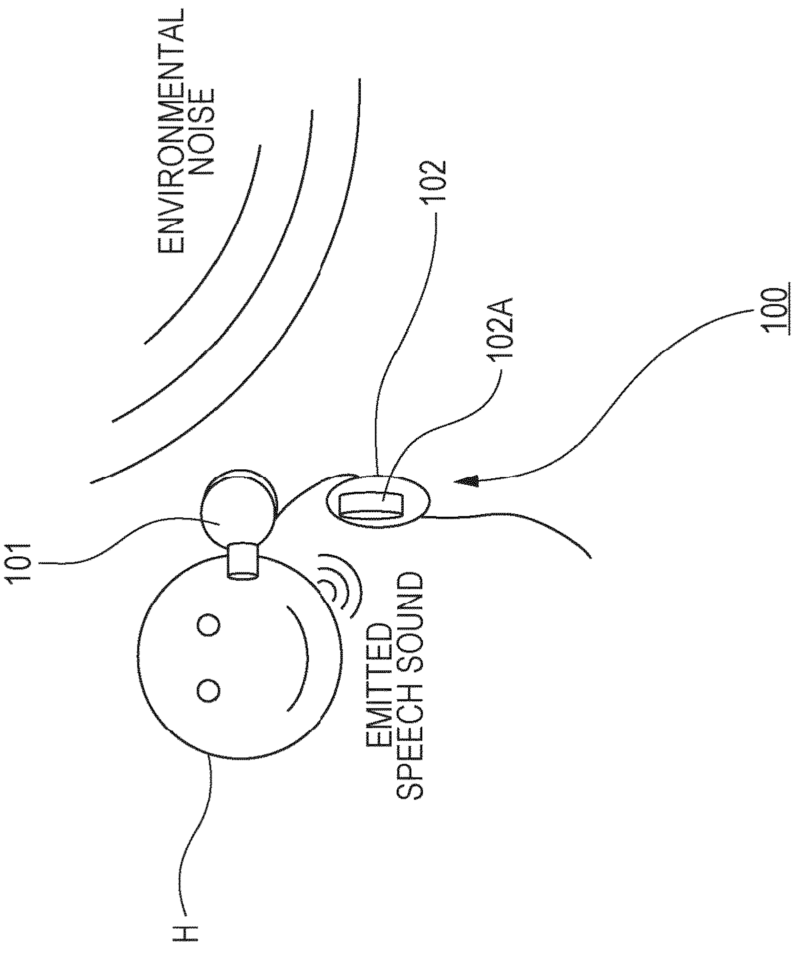
FIG. 13 is a diagram showing an example configuration of a conventional earpiece microphone.

In this sound collection system as an embodiment, as long as the inside of the housing of the attachment unit 1 maintains sufficient sealability, insulation against noise that propagates from the outside of the housing becomes sufficiently higher even in loud environments, and noise is effectively prevented from entering the internal microphone 1B. Accordingly, speech voice can be collected at a higher S/N ratio (signal-to-noise ratio) than that with the conventional earpiece microphone 100 (see FIG. 13) that collects speech voice via the outside.

The sound insulation should be strong enough to cover at least the band of noise to be restrained, and, in that sense, completely hermetic sealing is not required.

<2. Signal Processing for Sound Quality Improvement>

In the sound collection system of this embodiment that collects speech voice that propagates via the ear canal HA and performs the sound collection while securing the sealability of the internal space 1V having the internal microphone 1B provided therein, speech voice can be collected at a higher S/N ratio than that with the conventional earpiece microphone 100.

However, in a case where the sealability is relatively high as in a case with a conventional canal-type earphone, for example, gain (response) in the ear canal HA becomes greater in lower bands than in a normal free space. Therefore, the sound collection signal generated by the internal microphone 1B has relatively high response characteristics in lower bands.

Due to this influence, transmitted speech voice based on the sound collection signal generated by the internal microphone 1B is muffled in the lower bands, and is difficult for the person at the other end of the line to hear.

Figure 3:
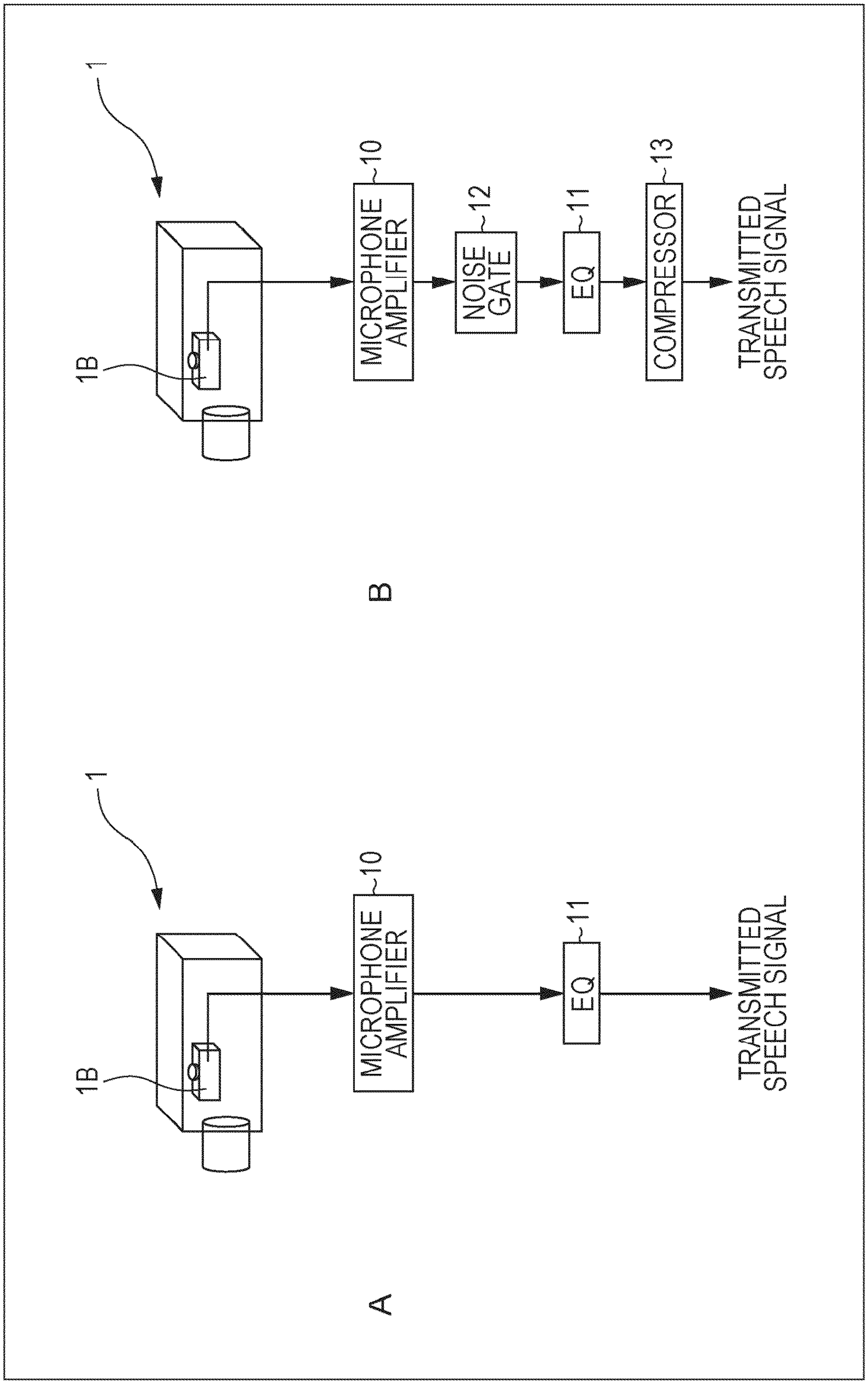
FIG. 3 is a diagram for explaining the configuration of a signal processing system for sound quality improvement.

Therefore, to correct the sound collection signal response characteristics in the lower bands, it is preferable to provide a signal processing means as an equalizer (EQ) as shown in A of FIG. 3.

Specifically, in the configuration shown in A of FIG. 3, a collection sound signal generated by the internal microphone 1B is amplified by the microphone amplifier 10, and an equalizing process (a characteristics correction process) is then performed by an equalizer 11.

Figure 4:
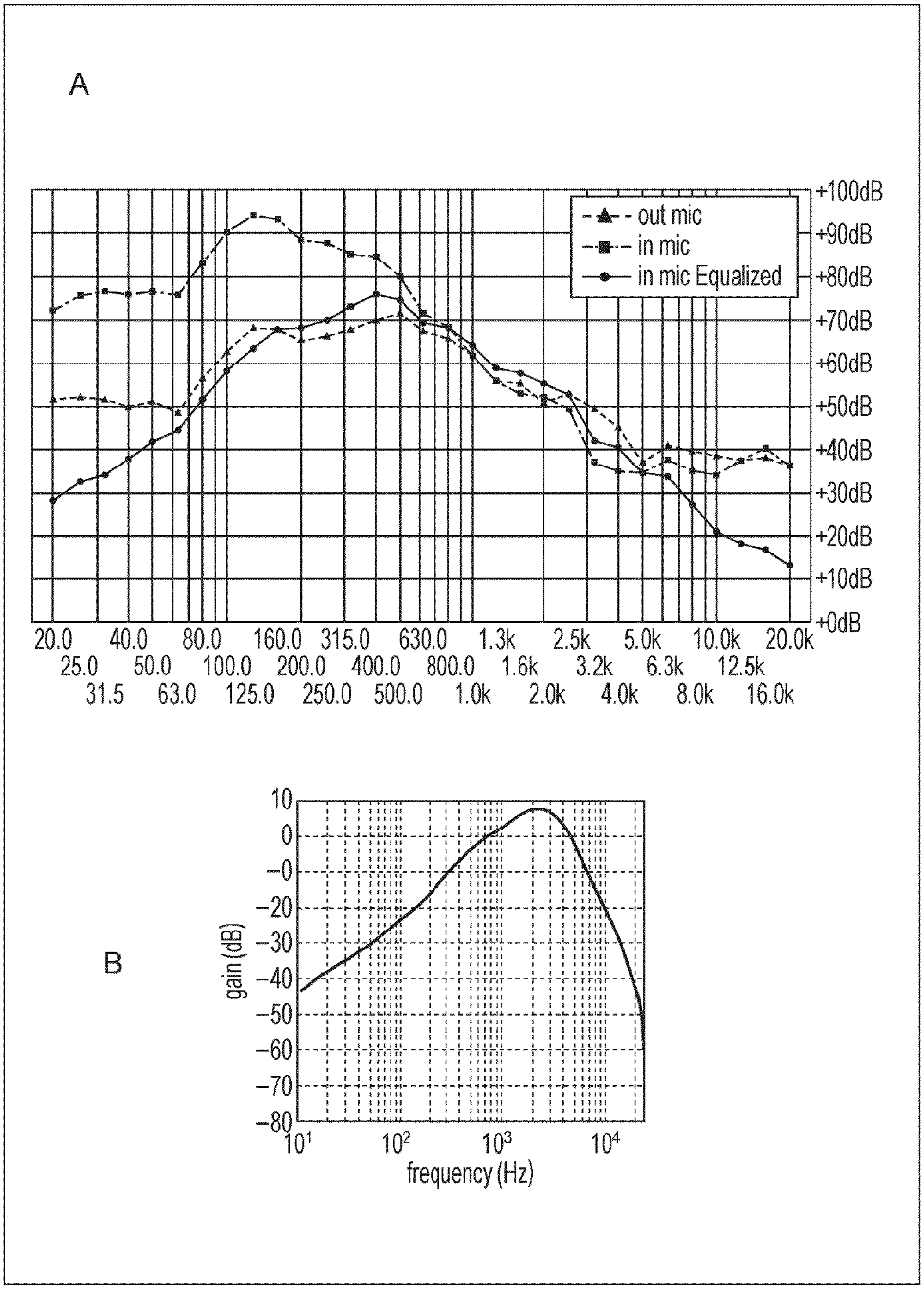
FIG. 4 is a diagram for explaining specific frequency characteristics to be set in the equalizer for sound quality improvement.

FIG. 4 is a diagram for explaining specific frequency characteristics to be set in the equalizer 11.

First, to explain that the low-frequency gain of a sound collection signal transmitted via the ear canal HA becomes larger, A of FIG. 4 shows the frequency characteristics of a sound collection signal obtained when a predetermined example conversation was collected by a microphone located outside the attachment unit 1 in a noise-free environment (the set of ▲ marks and a dashed line), in contrast with the frequency characteristics of a sound collection signal obtained when the same example conversation was collected by the internal microphone 1B in the internal space 1V connecting to the ear canal HA in a noise-free environment (the set of ■ marks and a dot-and-dash line).

The frequency characteristics shown in this drawing are temporally averaged on the frequency axis.

In the substantially sealed internal space 1V connecting to the ear canal HA, the diaphragm of the internal microphone 1B has greater vibrations than those of the outside as a non-sealed environment when low-frequency acoustic waves and vibrations are caused in the ear canal HA by speaking. As a result, a higher microphone output voltage than that of the microphone located outside is obtained in the lower bands.

As can be seen from A of FIG. 4, the sound collection signal generated by the internal microphone 1B (■ & the dot-and-dash line) is actually higher in the lower bands than the sound collection signal generated by the microphone located outside (▲ & the dashed line).

With the sound collection signal of the internal microphone 1B having the characteristics shown in A of FIG. 4, the speech voice transmitted to the person at the other end of the line is muffled, and becomes unclear and low. As a result, it might become difficult for the person at the other end to hear.

In view of this, the frequency characteristics of the sound collection signal generated by the internal microphone 1B are corrected to achieve a more natural frequency characteristics balance. In this manner, the clarity of the transmitted speech voice to be heard by the person at the other end is increased.

To do so, the frequency characteristics of the sound collection signal generated by the internal microphone 1B need to approximate the frequency characteristics of the sound collection signal generated by the microphone located outside.

Specifically, a filter (or the equalizer 11) expressed by the transfer function shown in B of FIG. 4 is prepared, and the frequency characteristics of the sound collection signal of the internal microphone 1B are corrected by the filter. That is, the sound collection signal frequency characteristics of the internal microphone 1B are corrected by the equalizer 11 having high-frequency emphasizing (low-frequency suppressing) filter characteristics as shown in B of FIG. 4.

After equalizing, more natural voice sound with a higher clarity than the voice sound prior to the equalizing can be obtained.

In A of FIG. 4, the set of ● marks and a solid line indicates the frequency characteristics of the sound collection signal of the internal microphone 1B after correction performed by the equalizer 11 having the filter characteristics shown in B of FIG. 4.

As can be seen from the frequency characteristics, the sound collection signal generated by the internal microphone 1B approximates the sound collection signal generated by the microphone located outside, and a more natural frequency characteristics balance is maintained.

So as to improve the sound quality of transmitted speech voice, it is effective to perform a noise gate process and a compressor process, as well as the correction by the equalizer 11, on the sound collection signal generated by the internal microphone 1B, as shown in B of FIG. 3.

Specifically, in the configuration shown in B of FIG. 3, after a noise gate processing unit 12 performs a noise gate process on the sound collection signal that has been generated by the internal microphone 1B and has passed through the microphone amplifier 10, the equalizer 11 performs the characteristics correction on the sound collection signal. A compressor 13 then performs a compressor process on the sound collection signal transmitted via the equalizer 11.

In the noise gate process, the noise gate processing unit 12 lowers the output signal level (or closes the gate) when the input signal level becomes equal to or lower than a certain level, and returns the output signal level to the original level (or opens the gate) when the input signal level becomes higher than the certain level.

As is normally conducted, parameters, such as the rate of attenuation of the output level, the open/close envelope of the gate, and the frequency bands to which the gate reacts, are appropriately set so that the clarity of speech voice will increase.

In the compressor process, the compressor 13 performs a process to adjust the temporal amplitude of the input sound collection signal.

Figure 5:
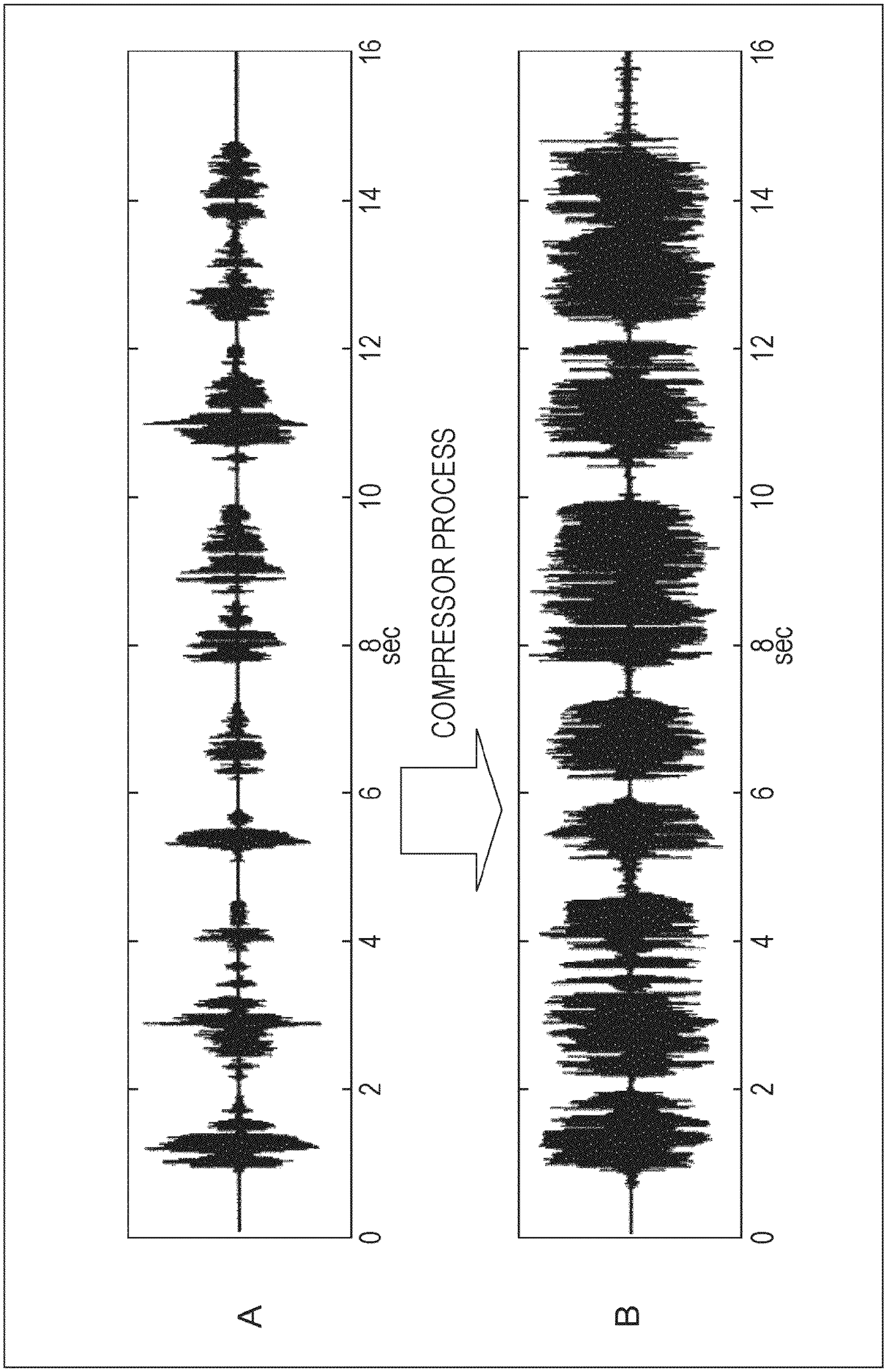
FIG. 5 is a diagram for explaining a compressor process.

Referring now to FIG. 5, the compressor process by the compressor 13 is described.

In FIG. 5, A of FIG. 5 shows the temporal waveform of a sound collection signal prior to the compressor process, and B of FIG. 5 shows the temporal waveform of the sound collection signal after the compressor process.

While the above described equalizer 11 improves sound quality by adjusting the frequency characteristics of a sound collection signal, the compressor process is performed to correct the waveform of the sound collection signal on the temporal axis.

In this embodiment, speech voice reaches the diaphragm of the internal microphone 1B via the ear canal HA by virtue of vibrations of the body such as flesh and bones of the wearer H, as described above. This means that the speech voice has a certain level of nonlinearity, unlike speech voice that propagates through the external air.

Therefore, the difference in speech voice volume that varies depending on the voice volume at the time of speaking might become larger than that in a case where sound collection is performed through normal propagation in the external air, and, if not corrected, the collected voice might become difficult to hear.

As can be seen from A of FIG. 5, the difference in voice volume is larger between each two emitted sound groups.

The compressor 13 then adjusts the temporal amplitude of the sound collection signal generated by the internal microphone 1B as shown in B of FIG. 5. That is, the difference in emitted speech voice volume is reduced.

As a result, the emitted speech voice becomes easier to hear, and sound quality is improved.

In this embodiment, the various kinds of signal processing on sound collection signals may be performed by an analog electrical circuit, or may be performed by digital signal processing via an ADC (A/D converter).

<3. Further S/N Ratio Improvement by Noise Cancelling in The Internal Space>

[3-1. First Embodiment]

As can be understood from the above explanation, sound collection via the ear canal HA described with reference to FIG. 2 is performed to achieve a higher S/N ratio from sound collection signals than in a case with the conventional earpiece microphone 100. To further improve the S/N ratio in this embodiment, a noise cancelling process is performed on noise components propagating in the internal space 1V of the attachment unit 1. That is, a speaker is provided in the internal space 1V, and noise cancelling sound is output from the speaker, to spatially reduce the noise components propagating from the outside into the internal space 1V. In this manner, the S/N ratio of sound collection signals generated by the internal microphone 1B is further improved.

Figure 6:
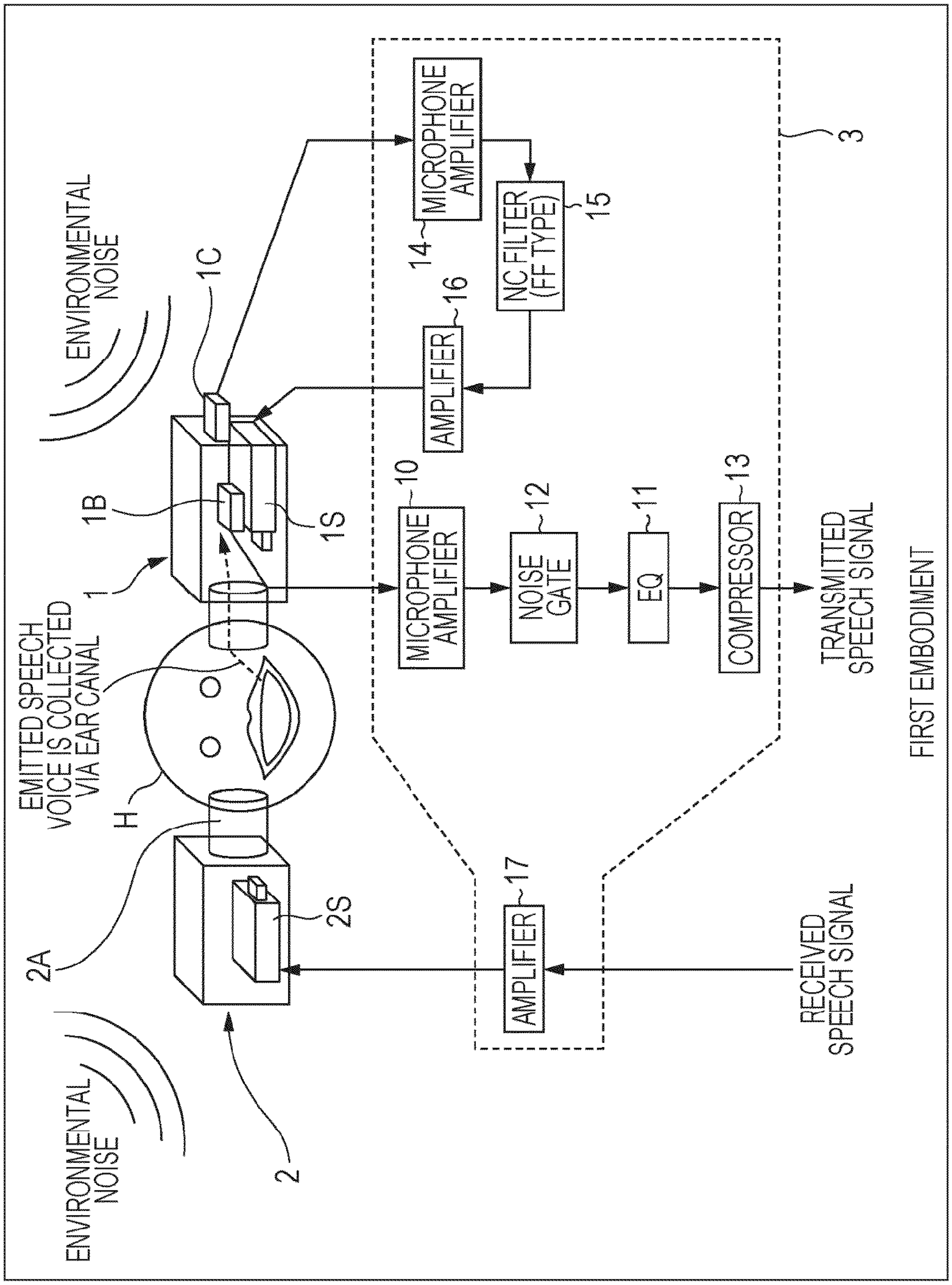
FIG. 6 is a diagram showing the configuration of a sound collection system as a first embodiment.

FIG. 6 is a diagram showing an example configuration (hereinafter referred to as the first embodiment) of a sound collection system as an embodiment to improve the S/N ratio by further performing a noise cancelling process.

In the description below, the same components as those already described are denoted by the same reference numerals as those used for the already described components, and explanation of them will not be repeated.

The sound collection system as the first embodiment is designed to include an attachment unit 1, an attachment unit 2, and a signal processing unit 3.

In this case, the attachment unit 1 is to be attached to one ear of a wearer H, and the attachment unit 2 is to be attached to the other ear of the wearer H.

Like the attachment unit 1, the attachment unit 2 is designed so that at least part of the attachment unit 2 can be inserted into an earhole portion HB of the wearer H, and accordingly, the attachment unit 2 can be attached to an ear of the wearer H. Specifically, the attachment unit 2 also includes an earhole insertion portion 2A having such a shape that can be inserted into the earhole portion HB of the wearer H, and the earhole insertion portion 2A is inserted into the earhole portion HB, so that the attachment unit 2 is attached to the ear of the wearer H.

The attachment unit 2 is also designed so that an internal space 2V connecting to the ear canal HA of the wearer H is formed when the attachment unit 2 is attached to the wearer H. The earhole insertion portion 2A is covered with a material having elasticity in its surface portion so that contact with the earhole portion HB is achieved at the time of attachment.

The attachment unit 2 has a speaker 2S provided in the internal space 2V thereof. The speaker 2S is provided for outputting received speech voice based on a received speech signal. That is, the speaker 2S is driven based on a received speech signal amplified by an amplifier 17 provided in the signal processing unit 3, and outputs received speech voice in accordance with the received speech signal.

In this example, the speaker S2 is of a BA (balanced armature) type, with the installation space being taken into consideration.

In the sound collection system of this example, an external microphone 1C that is installed to directly collect sound generated outside the housing of the attachment unit 1 is provided for the attachment unit 1. The attachment unit 1 in this case also has a speaker 1S provided in the internal space 1V thereof.

In this example, the external microphone 1C is a MEMS microphone, like the internal microphone 1B.

The speaker 1S is also a BA-type speaker, with the installation space being taken into account.

The external microphone 1C is installed to be able to perform sound collection compatible with a noise cancelling process according to the FF (feedforward) method described later, and the sound collection port thereof is not necessarily in direct contact with the outside of the housing of the attachment unit 1.

In addition to the above described amplifier 17 for received speech signal amplification, the signal processing unit 3 includes a microphone amplifier 10, an equalizer 11, a noise gate processing unit 12, and a compressor 13, which have been described above with reference to FIG. 3, and also includes a microphone amplifier 14, a NC filter 15 (NC: noise cancelling), and an amplifier 16.

The microphone amplifier 10, the equalizer 11, the noise gate processing unit 12, and the compressor 13 have already been described, and therefore, explanation of them is not repeated herein.

A sound collection signal generated by the external microphone 1C attached to the attachment unit 1 is amplified by the microphone amplifier 14, and is then input to the NC filter 15.

Based on the sound collection signal that is input from the external microphone 1C via the microphone amplifier 14, the NC filter 15 generates a noise cancelling signal according to the FF method. Specifically, the NC filter 15 performs an equalizing process compatible with the FF method on the sound collection signal, to generate the noise cancelling signal for reducing the noise propagating in the internal space 1V of the attachment unit 1.

The amplifier 16 amplifies the noise cancelling signal obtained at the NC filter 15, to drive the speaker 1S in the attachment unit 1. Noise cancelling sound based on the noise cancelling signal is then output from the speaker 1S. As a result, the noise components propagating in the internal space 1V are reduced.

The NC process may be realized by using an analog filter circuit, or may be realized by digital signal processing that involves an ADC according to a method disclosed in Reference Document 1 mentioned below.

Reference Document 1: Japanese Patent Application Laid-Open No. 2008-193421

In the above described sound collection system as the first embodiment, the S/N ratio of emitted speech voice collection signals is secured by virtue of the (passive) sound insulating properties of the housing of the attachment unit 1 against environmental noise, and noise in the internal space 1V is reduced by the NC process. In this manner, the S/N ratio of emitted speech voice collection signals can be further increased.

It should be noted that speech voice of the wearer H propagates based on vibrations through the ear canal HA, regardless of the NC process. Therefore, the speech voice is collected by the same amount as that in a case where the NC process is not performed.

Also, with the configuration of the first embodiment shown in FIG. 6, a sound insulating effect can be achieved at either ear, and accordingly, the wearer H can easily hear received speech voice.

A specific configuration of the sound collection system of this embodiment including the signal processing unit 3 that realizes the above described NC process for noise cancelling in the internal space 1V and the various kinds of signal processing (from the equalizer 11 to the compressor 13) for sound quality improvement may be of an "integrated type" having the signal processing unit 3 provided in the attachment unit 1, or of a "separated type" having the signal processing unit 3 provided outside the attachment unit 1.

Figure 7:
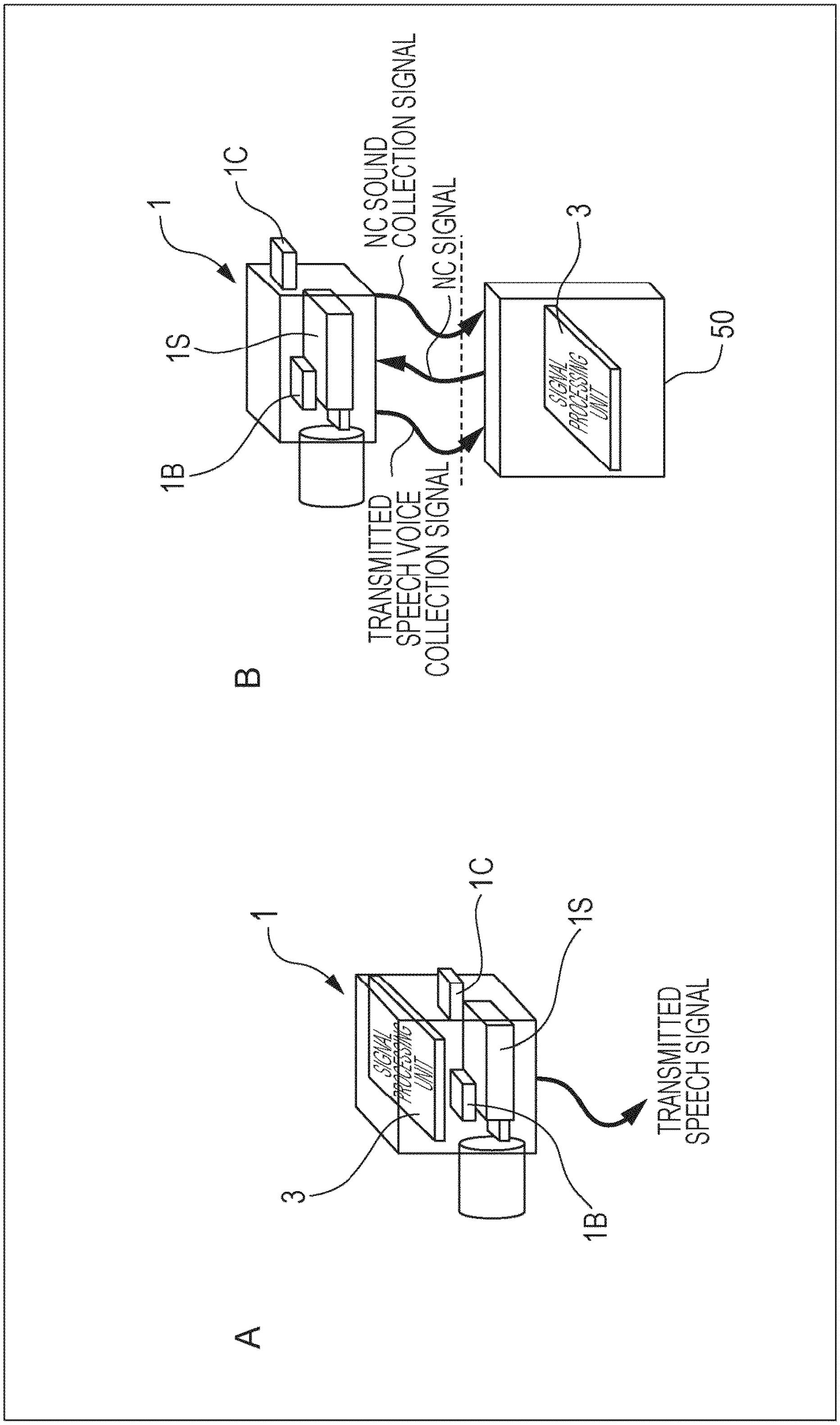
FIG. 7 is a diagram showing example configurations of an "integrated type" and a "separated type" in a sound collection system of an embodiment.

FIG. 7 is a diagram showing example configurations of the "integrated type" and the "separated type".

First, the configuration of the "integrated type" shown in A of FIG. 7 has the signal processing unit 3 provided in the housing of the attachment unit 1. In this case, a sound collection signal that is generated by the internal microphone 1, has a S/N ratio improved by the NC process using the NC filter 15, and has sound quality improved by the equalizer 11 or the like is output as a transmitted speech signal from the attachment unit 1 to an external device 50 (an information processing device such as a smartphone).

In the case of the "integrated type", the signal processing unit (the amplifier 17 in the case shown in FIG. 6) related to the channel on the side of the attachment unit 2 as the channel on the opposite side from the attachment unit 1 is preferably installed on the side of the attachment unit 2. If the signal processing unit 3 shown in FIG. 6 is installed on the side of the attachment unit 1 as it is, it is necessary to prepare an additional line for transmitting a received speech signal amplified by the amplifier 17 from the side of the attachment unit 1 to the side of the attachment unit 2.

In the configuration of the "separated type" shown in B of FIG. 7, the signal processing unit 3 is installed in the external device 50. In this case, a sound collection signal generated by the internal microphone 1 (the transmitted speech voice collection signal in the drawing) and a sound collection signal generated by the external microphone 1C (the NC sound collection signal in the drawing) are transmitted from the attachment unit 1 to the external device 50. Meanwhile, a noise cancelling signal (the NC signal in the drawing) amplified by the amplifier 16 of the signal processing unit 3 is transmitted from the external device 50 to the attachment unit 1 (the speaker 1S).

Although not shown in the drawing, in the case of the "separated type", a received speech signal amplified by the amplifier 17 is transmitted from the external device 50 to the attachment unit 2 (the speaker 2S).

[3-2. Second Embodiment]

Figure 8:
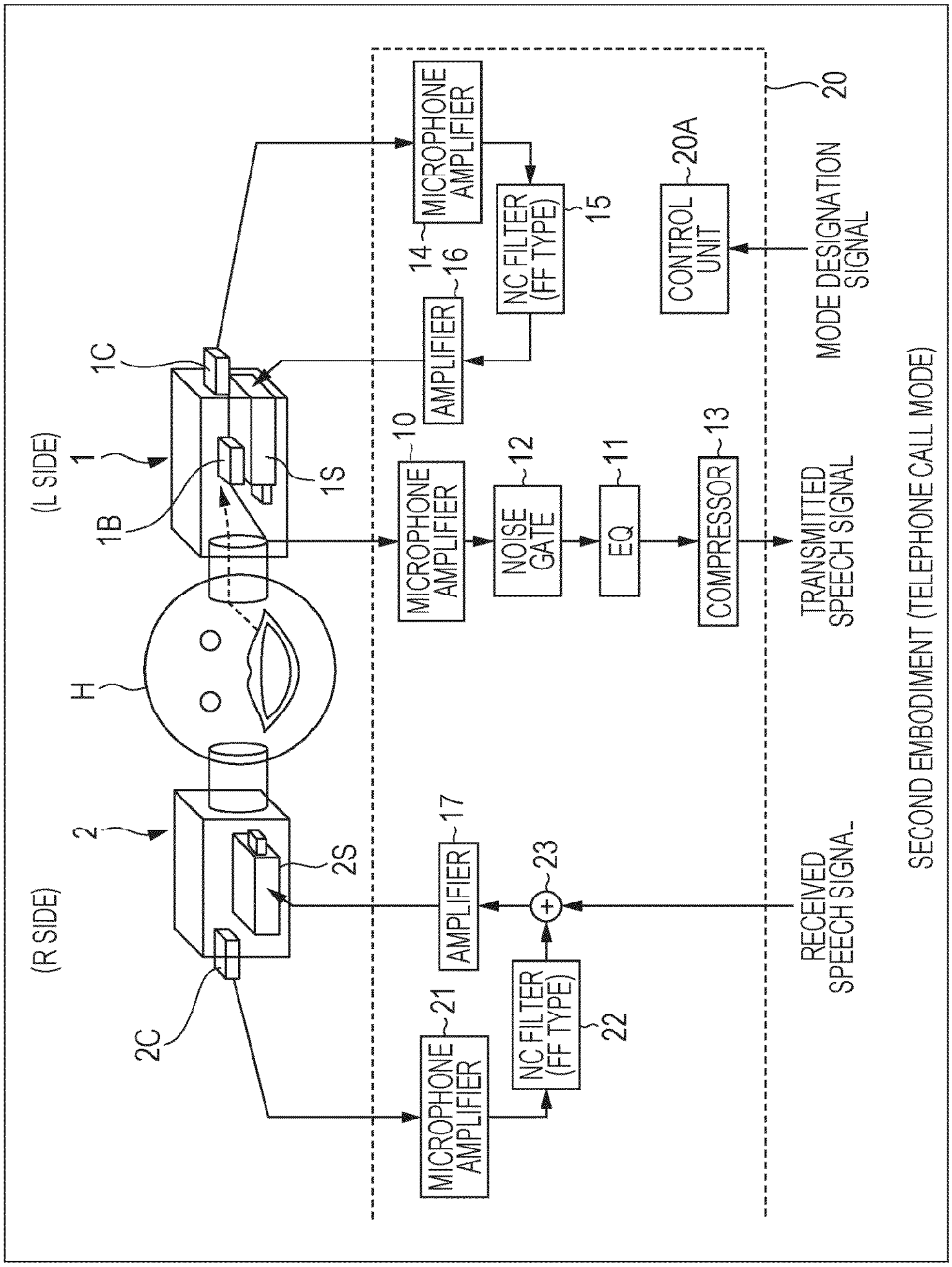
FIG. 8 is a diagram showing the configuration of a sound collection system (in a telephone call mode) as a second embodiment.
Figure 9:
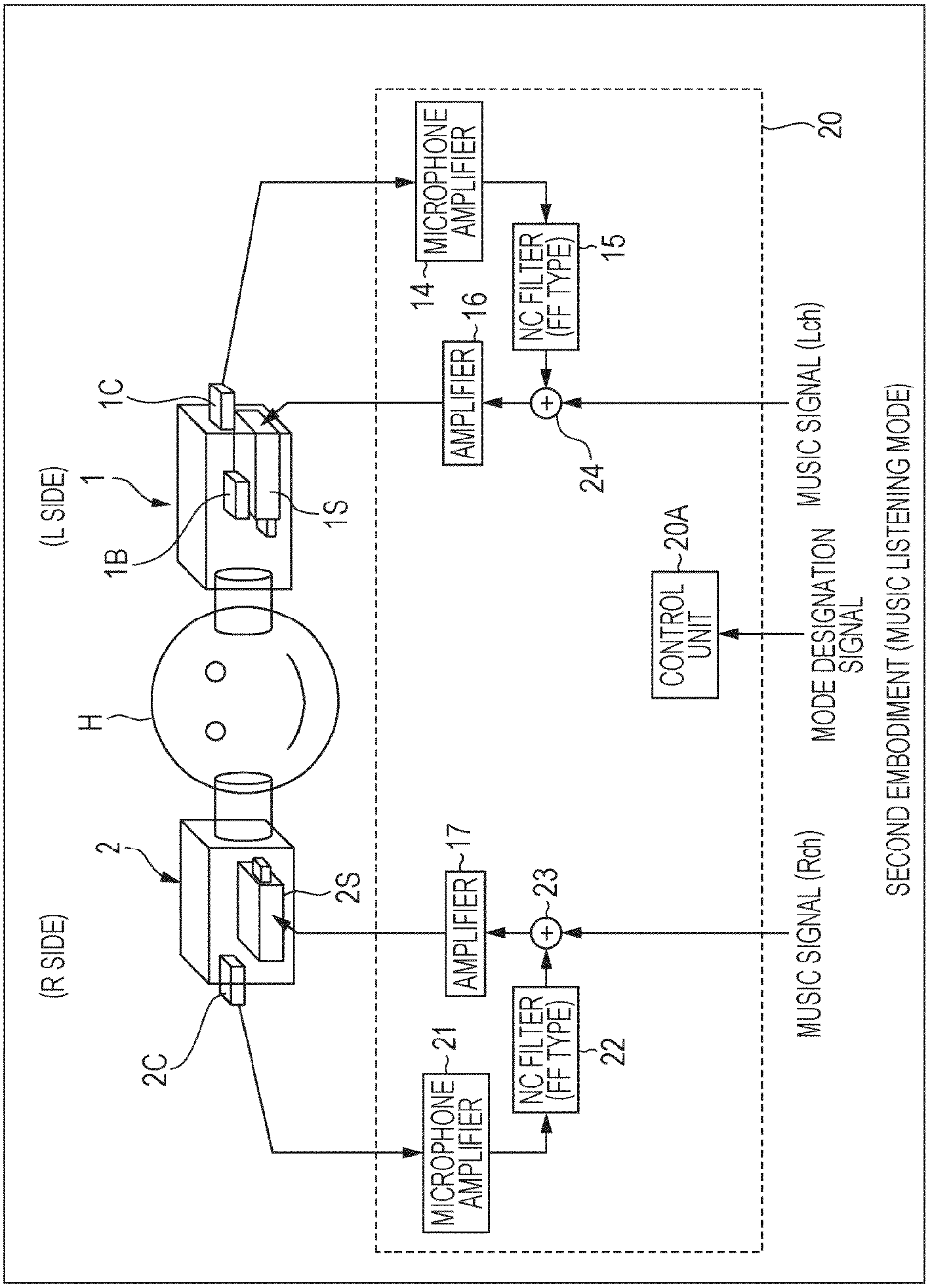
FIG. 9 is a diagram showing the configuration of the sound collection system (in a music listening mode) as the second embodiment.

FIGS. 8 and 9 are diagrams for explaining configurations of a sound collection system as a second embodiment.

In the second embodiment, an external microphone 2C and a NC filter 22 are provided in the channel (hereinafter also referred to as "ch") on the side of the attachment unit 2, so as to reduce noise in the internal space 2V and make hearing of received speech voice easier for the wearer H. Also, a control unit 20A shown in the drawing is provided so as to realize switching between a telephone call mode and a music listening mode.

First, the second embodiment is based on the premise that the signal processing unit 20 in the drawings (FIGS. 8 and 9) is formed with a DSP (Digital Signal Processor) and a MPU (Micro Processor), for example, and the respective blocks shown in the signal processing unit 20 in the drawings represent the functions to be realized by the DSP and the MPU.

In the second embodiment, the side of the attachment unit 1 is indicated as the Lch side, and the side of the attachment unit 2 is indicated as the Rch side, for example.

Like the external microphone 1C installed on the side of the attachment unit 1, the attachment unit 2 in this case has the external microphone 2C attached thereto, so as to obtain sound collection signals compatible with noise canceling according to the FF method.

In the telephone call mode shown in FIG. 8, the functions of the signal processing unit 20 include the functions of a microphone amplifier 21, the NC filter 22, and an adder 23, as well as the same functions as those of the respective components (from the microphone amplifier 10 to the amplifier 17) of the signal processing unit 3 of the first embodiment.

The microphone amplifier 21 amplifies a sound collection signal generated by the external microphone 2C.

The NC filter 22 performs the same equalizing process according to the FF method as that of the above described NC filter 15, on the sound collection signal that has been generated by the external microphone 2C and been amplified by the microphone amplifier 21. As a result, a noise cancelling signal for reducing noise propagating in the internal space 2V is obtained.

The adder 23 adds the noise cancelling signal obtained by the NC filter 23 to a received speech signal, and supplies the signal obtained as a result of the adding to the amplifier 17.

With the above configuration on the Rch side, noise in the internal space 2V of the attachment unit 2 is reduced in the sound collection system of this example. Accordingly, in the telephone call mode shown in FIG. 8, hearing of received speech voice becomes easier for the wearer H.

It should be noted that, in the telephone call mode shown in FIG. 8, the Lch side on which the attachment unit 1 is installed achieves the effect to increase the S/N ratio of emitted speech voice collection signals and the effect to improve sound quality, as in the first embodiment.

The control unit 20A controls the configuration of the function unit of the signal processing unit 20 to switch between the configuration shown in FIG. 8 and the configuration shown in FIG. 9, in accordance with a mode designation signal for designating the telephone call mode or the music listening mode.

In the music listening mode shown in FIG. 9, a Lch music signal and a Rch music signal are first input to the signal processing unit 20.

In the music listening mode, the function unit (from the microphone amplifier 10 to the compressor 13 shown in FIG. 8) corresponding to the signal processing system for sound collection signals generated by the internal microphone 1B are removed on the Lch side, which is the side on which the attachment unit 1 is located. Instead, a function unit serving as an adder 24 for adding the Lch music signal to the noise cancelling signal that is output from the NC filter 15 is formed.

In this case, the combined signal generated by the adder 24 adding the Lch music signal and the noise cancelling signal is amplified by the amplifier 16, and is output from the speaker 1S.

On the Rch side, the configuration of the function unit is the same as that in the telephone call mode shown in FIG. 8, except that the Rch music signal, instead of a received speech signal, is input to the adder 23.

As described above, in the music listening mode, the sound collection system as the second embodiment has the same function as that of a conventional sound reproducing system having a NC function, to cause the wearer H to listen to sound based on the Lch and Rch music signal in a quiet environment having noise reduced.

As can be understood from the above description, the respective attachment units (1 and 2) of the sound collection system as the second embodiment can be realized simply by adding the internal microphone 1B to the earphone unit on one of the channels of the earphone system compatible with a NC system according to the FF method.

That is, since an earphone device compatible with a NC system according to the FF method originally has the right and left speakers (1S and 2S) and the external microphones (1C and 2C) for collecting noise for NC, the respective attachment units of the second embodiment can be realized simply by adding the external microphone 1B to one of the earphone units.

The number of changes that need to be made to an existing product can be reduced in this manner. Accordingly, an increase of the product cost can be effectively reduced in realizing the system as the second embodiment.

It should be noted that the second embodiment can also have both of the configurations of the "integrated type" and the "separated type" shown in FIG. 7.

This aspect also applies to the embodiments described later.

The sound collection system of the second embodiment can be formed with hardware.

The configuration of the signal processing unit 20 on the Lch side in such a case includes the components from the microphone amplifier 10 to the compressor 13 shown in FIG. 8, and also includes the microphone amplifier 14, the NC filter 15, the amplifier 14, and the adder 24 shown in FIG. 9. In this configuration, a Lch music signal is input to the adder 24 via a switch. The control unit 20A stops the supply of the Lch music signal to the adder 24 by turning off the switch in the telephone call mode, and allows the supply of the Lch music signal to the adder 24 by turning on the switch in the music listening mode. The emitted speech voice collection system is designed to output a sound collection signal (a transmitted speech signal) via the components from the microphone amplifier 10 to the compressor 13 only in the telephone call mode.

The Rch side is designed to have the configurations shown in FIGS. 8 and 9 in a case where supplies of received speech signals and music signals are to be conducted outside the signal processing unit 20. Specifically, the Rch side includes the amplifier 17, the microphone amplifier 17, the NC filter 22, and the adder 23, and a received speech signal or a Rch music signal is input to the adder 23.

[3-3. Third Embodiment]

In each of the foregoing embodiments, only noise cancelling sound is output but no received speech voice is output from the ch on the side for collecting emitted speech sound at the time of a telephone call. Therefore, hearing of received speech voice is performed only at the ch on the side on which emitted speech voice is not collected.

In a third embodiment, received speech voice is also output from the ch on the side for collecting emitted speech voice, and hearing of received speech voice is performed at both ears of a wearer H.

Figure 10:
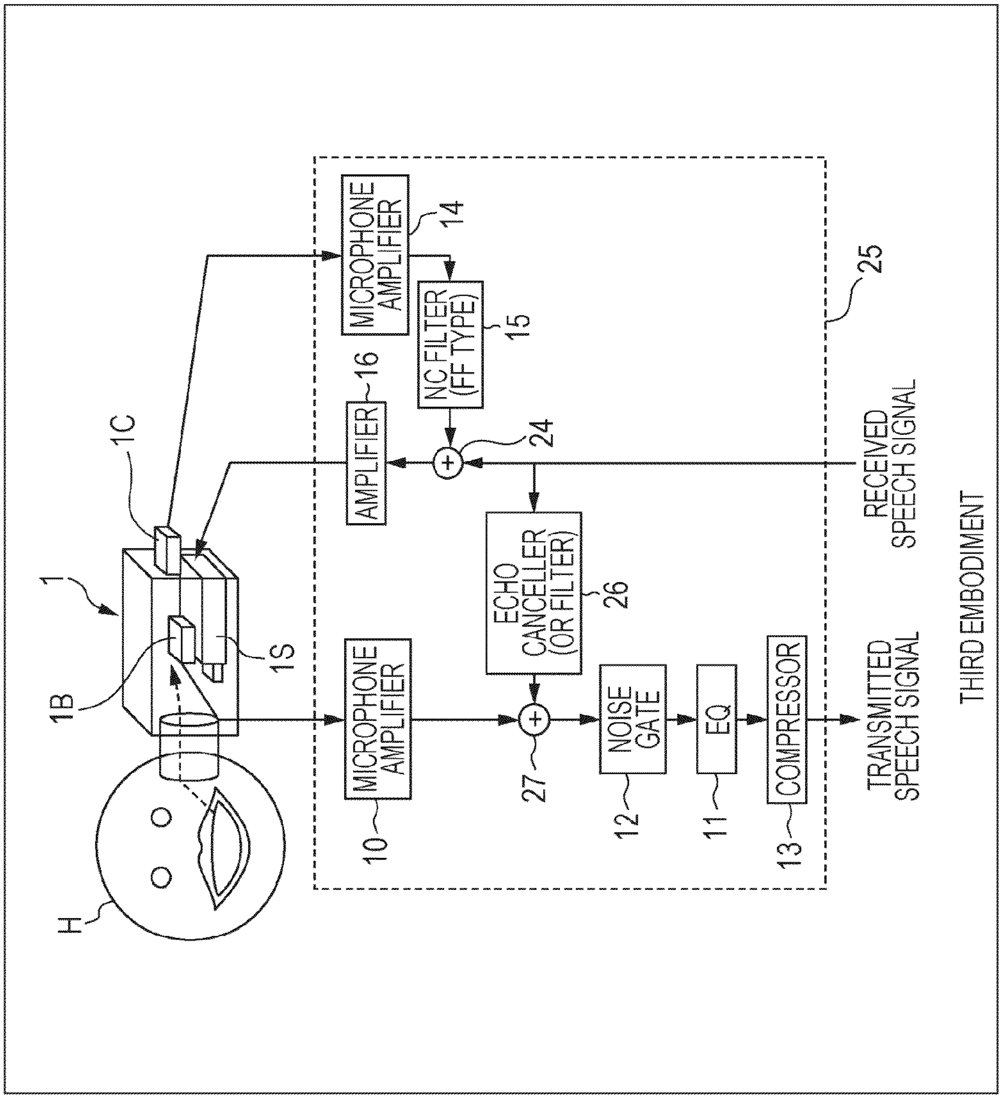
FIG. 10 is a diagram showing the configuration of a sound collection system as a third embodiment.

FIG. 10 is a diagram showing the configuration of a sound collection system as the third embodiment.

Although only the configurations of an attachment unit 1 and the signal processing system of the ch on the side of the attachment unit 1 are shown in FIG. 10, in the third embodiment, an attachment unit 2 and the signal processing system of the ch on the side of the attachment unit 2 may have any configurations that can cause a wearer H to hear received speech sound based on received speech signals, such as the configuration shown in FIG. 6 or 8.

First, the sound collection system in this case differs from the sound collection system of the first embodiment shown in FIG. 6 in that the signal processing unit 3 is replaced with a signal processing unit 25. The signal processing unit 25 differs from the signal processing unit 3 in further including an adder 24, an echo canceller 26, and an adder 27.

Like the adder 24 shown in FIG. 9, the adder 24 adds a received speech signal to a noise cancelling signal output from a NC filter 15, and outputs the combined signal to an amplifier 16.

As a result, the speaker 1S in the attachment unit 1 outputs noise cancelling sound and received speech voice based on the received speech signal.

With the above described configuration, the received speech voice (and the noise cancelling sound) output from the speaker 1S is released into the internal space 1V of the attachment unit 1, and the internal microphone 1B collects the received speech voice. That is, the internal microphone 1B in this case collects the received speech voice as well as emitted speech voice of the wearer H. As a result, it might become difficult for the person at the other end to hear the emitted speech voice.

In view of this, the echo canceller 26 and the adder 27 are provided in the third embodiment, so as to subtract the component of the received speech voice collected by the internal microphone 1B via the internal space 1V from the sound collection signal generated by the internal microphone 1B.

The echo canceller 26 performs a filtering process (an equalizing process) using a transfer function that represents the characteristics of the speaker 1S, the sound space characteristics of the internal space 1V, and the microphone characteristics of the internal microphone 1B, so that not the received speech signal but the received speech signal component that has passed through the speaker 1S, the internal space 1V, and the internal microphone 1B, and is to be actually added to the sound collection component of emitted speech voice is subtracted from the sound collection signal.

The adder 27 adds the received speech signal subjected to the filtering process by the echo canceller 26, to the sound collection signal that has been generated by the internal microphone 1B and has passed through the microphone amplifier 10, and outputs the result to the noise gate processing unit 12.

With the above described configuration, the received speech voice component to be heard by the person at the other end can be effectively reduced. As a result, the person at the other end can hear the emitted speech voice more clearly.

Although the echo canceller that successively updates the filter contents is provided in the above described example, a filter that performs a regular equalizing process taking into account the above described characteristics (the characteristics of the speaker 1S, the sound space characteristics of the internal space 1V, and the microphone characteristics of the internal microphone 1B) may be provided in place of the echo canceller.

[3-4. Fourth Embodiment]

Figure 11:
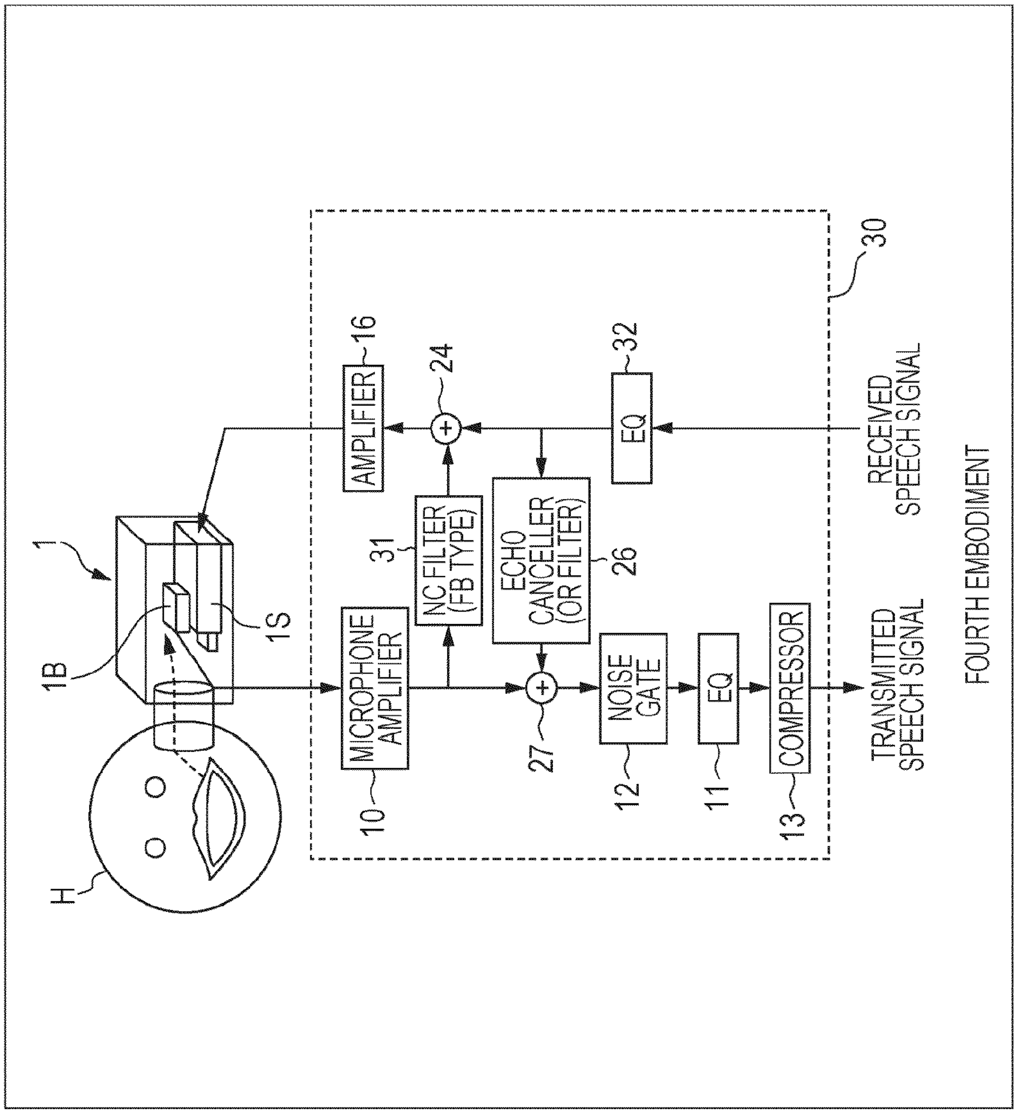
FIG. 11 is a diagram showing the configuration of a sound collection system as a fourth embodiment.

FIG. 11 is a diagram showing the configuration of a sound collection system as a fourth embodiment.

In the fourth embodiment, a FB (feedback) method, instead of the FF method, is adopted as the noise cancelling method.

As shown in the drawing, the sound collection system in this case differs from the sound collection system of the third embodiment shown in FIG. 10 in that the external microphone 1C is not provided for the attachment unit 1, and a signal processing unit 30 is provided in place of the signal processing unit 25.

The signal processing unit 30 differs from the signal processing unit 25 in that the microphone amplifier 14 and the NC filter 15 used in the NC process according to the FF method are not provided, but a NC filter 31 compatible with the FB method and an equalizer 32 are provided.

It should be noted that the fourth embodiment is the same as the third embodiment in that a received speech signal component reproduced by the speaker 1S is subtracted by using an echo canceller 26.

As is widely known, the FB method is a method of generating a noise cancelling signal based on a result of collection of noise propagating in the internal space 1V (the space in which sound is output from the speaker 1S) of the attachment unit 1.

The internal microphone 1B also serves as the microphone that performs the noise collection according to the FB method.

In this case, the sound collection signal generated by the internal microphone 1B is amplified by the microphone amplifier 10, and is then supplied to the adder 27 and the NC filter 31 as shown in the drawing.

The NC filter 31 performs an equalizing process according to the FB method on the sound collection signal that is generated by the internal microphone 1B and is input via the microphone amplifier 10, to generate a noise cancelling signal for reducing noise propagating in the internal space 1V of the attachment unit 1.

The adder 24 adds the noise cancelling signal obtained at the NC filter 31 to the received speech signal subjected to the equalizing process by the equalizer 32. The combined signal is then output to the amplifier 16.

As a result, noise cancelling sound compatible with the FB method is output from the speaker 1S, and noise in the internal space 1V is reduced accordingly.

In the case where the FB method is adopted, unlike in the case of the FF method, sound based on a received speech signal is reproduced by the speaker 1S, and then enters the internal microphone 1B (also serving as a noise collection microphone in this case). The sound is affected by the NC effect, and the sound quality differs from that in the case of regular reproduction. Therefore, the equalizer 32 that corrects sound quality by taking such influence into account beforehand is provided for received speech signals.

With the above described configuration of the fourth embodiment, noise that propagates in the internal space 1V and is to be heard by the wearer H is reduced. Accordingly, the same effect to improve the S/N ratio of transmitted speech signals is achieved as in the above described first through third embodiments.

Also, by adopting the FB method, the external microphone 1C can be advantageously excluded.

[3-5. Fifth Embodiment]

Figure 12:
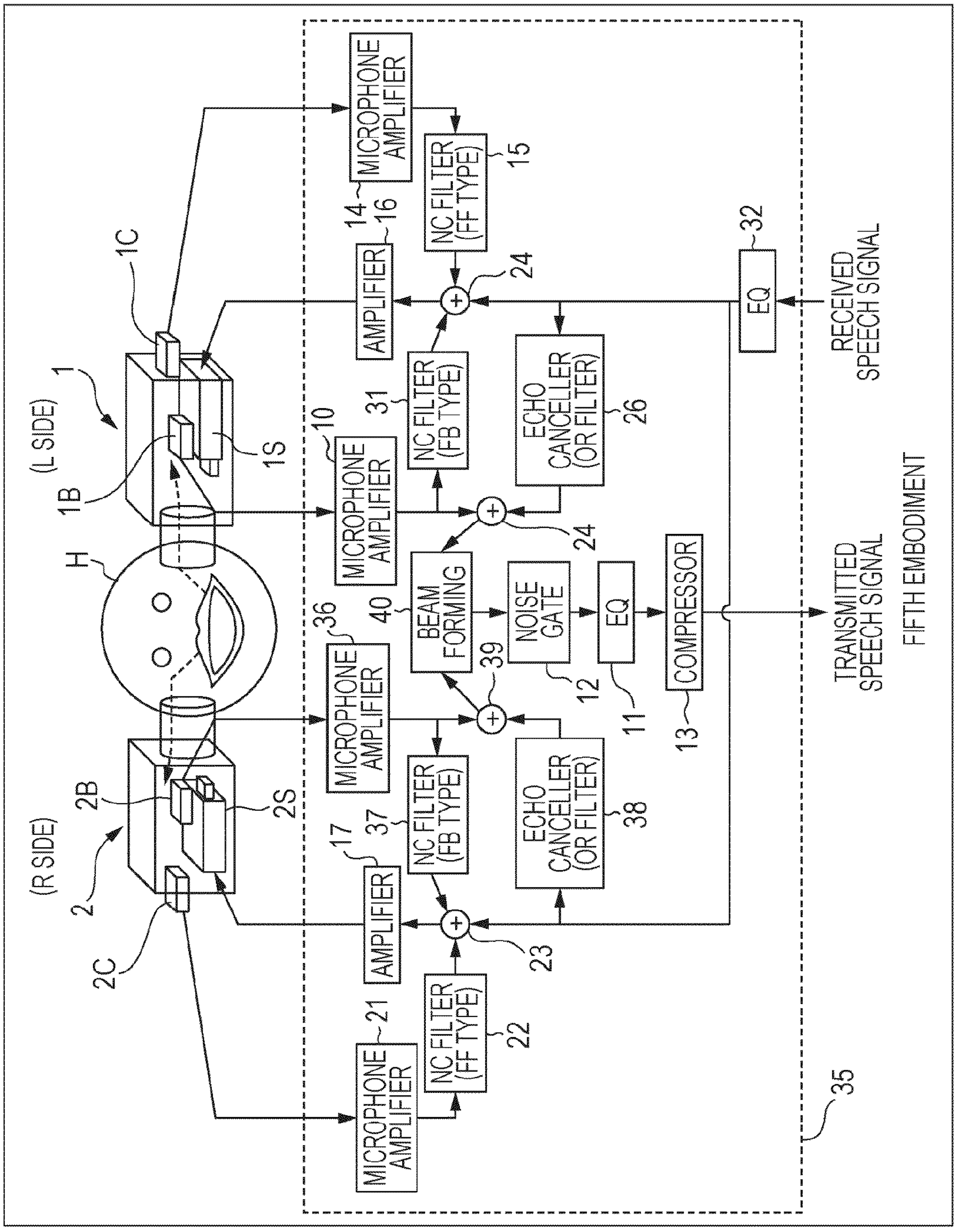
FIG. 12 is a diagram showing the configuration of a sound collection system as a fifth embodiment.

FIG. 12 is a diagram showing the configuration of a sound collection system as a fifth embodiment.

In the fifth embodiment, the S/N ratio of emitted speech voice collection signals is further improved by performing a so-called beam forming process on emitted speech signals generated by collecting sound in both L and R channels.

Also, a so-called FF+FB method for simultaneously implementing the FF method and the FB method is adopted as the noise cancelling method to further reduce noise in the internal space of an attachment unit and improve the S/N ratio in emitted speech voice collection.

In the fifth embodiment, the speaker 1S (and the speaker 2S) also outputs received speech voice, as in the above described third and fourth embodiments.

In FIG. 12, the sound collection system of the fifth embodiment differs from the sound collection system of the second embodiment shown in FIG. 8 in that an internal microphone 2B is provided in the internal space 2V of the attachment unit 2 so that collection of emitted speech voice through the ear canal HA and a noise cancelling process according to the FB method can also be performed on the Rch side. Also, a signal processing unit 35 is provided in place of the signal processing unit 20.

The signal processing unit 35 differs from the signal processing unit 20 in the following aspects.

First, an adder 24, a NC filter 31, an echo canceller 26, and an adder 27 are added to the configuration on the Lch side, which is the side of the attachment unit 1, so as to cope with the FB method and received speech voice outputs.

Meanwhile, a microphone amplifier 36 and a NC filter 37 for coping with the FB method, and an echo canceller 38 and an adder 39 are added to the configuration on the Rch side, which is the side of the attachment unit 2.

Also, an equalizer 32 that performs an equalizing process on a received speech signal to cope with the FB method, and a beam forming unit 40 are added as components to be shared between the two channels.

On the Lch side, a sound collection signal that has been generated by the internal microphone 1B and been amplified by the microphone amplifier 10 is input to the NC filter 31 compatible with the FB method, and the output of the NC filter 31 is supplied to the adder 24.

The adder 24 in this case adds the output of the NC filter 31, an output of the NC filter 15 compatible with the FF method, and a received speech signal subjected to the equalizing process by the equalizer 32 used by the FB method. The result is output to the amplifier 16.

Likewise, on the Rch side, a sound collection signal that has been generated by the internal microphone 2B and been amplified by the microphone amplifier 36 is input to the NC filter 37 compatible with the FB method, and the output of the NC filter 37 is supplied to the adder 23.

The adder 23 in this case adds the output of the NC filter 37, an output of the NC filter 22 compatible with the FF method, and a received speech signal having passed through the equalizer 32. The result is output to the amplifier 17.

With the above described configurations on the Lch side and the Rch side, a noise cancelling process according to the FF+FB method can be performed in both Lch and Rch.

As disclosed in Reference Document 2 mentioned below, according to the FF+FB method, a greater noise reduction effect can be achieved in a wider band, compared with the noise reduction effect in a case where only the FF method or the FB method is implemented. That is, with the above described configuration, noise in the internal spaces 1V and 2V can be more effectively reduced, and the S/N ratio of emitted speech voice collection signals can be further improved.

As noise in the internal spaces 1V and 2V can be more effectively reduced, hearing of received speech voice is made even easier for the wearer H.

It goes without saying that, in this case, the filter characteristics of the respective NC filters (15, 22, 31, and 37) should be appropriately set according to the FF+FB method.

Reference Document 2: Japanese Patent Application Laid-Open No. 2008-116782

As the speakers 1S and 2S output received speech voice, the same echo canceller 26 as that of the above described third and fourth embodiments, and an echo canceller 38 are provided in the signal processing unit 35.

The echo canceller 26 receives a received speech signal having passed through the equalizer 32, and performs the same echo cancelling process as that described in the third embodiment on the received speech signal. The adder 27 adds the output of the echo canceller 26 to a sound collection signal that has been generated by the internal microphone 1B and been amplified by the microphone amplifier 10.

Meanwhile, the echo canceller 38 receives a received speech signal having passed through the equalizer 32, and performs the same echo cancelling process as that described in the third embodiment on the received speech signal. The adder 39 adds the output of the echo canceller 38 to a sound collection signal that has been generated by the internal microphone 2B and been amplified by the microphone amplifier 36.

With the above described configuration, received speech voice components to be mixed with sound collection signals generated by the internal microphones 1B and 2B are reduced, and as a result, the emitted speech voice to be heard by the person at the other end can be made clearer.

The beam forming unit 40 is also provided in the signal processing unit 35.

The beam forming unit 40 receives a sound collection signal that has been generated by the internal microphone 1B and is obtained from the adder 27 (a Lch-side sound collection signal), and a sound collection signal that has been generated by the internal microphone 2B and is obtained from the adder 39 (a Rch-side sound collection signal). The beam forming unit 40 then performs a beam forming process.

The simplest specific example of the beam forming process using the Lch and Rch sound collection signals may be a process in which the Lch sound collection signal is added to the Rch sound collection signal.

In the configuration shown in FIG. 12, the internal microphone 1B that performs emitted speech voice collection on the Lch side and the internal microphone 2B that performs emitted speech voice collection on the Rch side are located at the same distance from the mouth (the vocal cords) of the wearer H as the source of the emitted speech voice. Accordingly, the sound coming from the direction of the source of the emitted speech voice (via the ear canal HA) can be efficiently extracted by adding the sound collection signals at the beam forming unit 40, and the sound coming from the other directions (noise components) can be suppressed. That is, the S/N ratio of emitted speech voice collection signals can be further improved.

Specific example techniques that can be used in the beam forming process include not only the above described adding operation but also a technique of determining voice components coming from the direction of the sound source based on a result of sound analysis conducted on sound collection signals, and extracting only the voice components from the direction of the sound source based on the determination result. At this point, a process of determining dominant components in the sound collection signals may be performed as a specific process in the sound analysis.

To sum up the beam forming process in this case, voice components coming from the direction of the sound source should be emphasized, and voice components coming from the other directions should be suppressed.

In the fifth embodiment, the signal processing for further improving the S/N ratio of emitted speech voice collection signals may be a noise reduction process according to a SS (Spectrum Subtraction) method, for example, as well as the above described beam forming process.

The noise reduction process according to the SS method is disclosed in Reference Document 3 mentioned below, for example.

A configuration for simultaneously performing a noise cancelling process according to the FF method or the FB method and the noise reduction process according to the SS method or the like is also disclosed in Reference Document 3 mentioned below.

Reference Document 3: Japanese Patent Application Laid-Open No. 2010-11117

<4. Modifications>

Although embodiments according to the present technique have been described so far, the present technique is not limited to the above described specific examples.

For example, a sound collection system according to the present technique is used for telephone calls in the above described examples. However, the present technique can be suitably applied to a system for recording collected speech signals.

In the above descriptions, sound collection is monaurally performed. However, in a case where the present technique is applied to the above described recording system, stereo sound collection can also be performed. In this case, the equalizer 11, the noise gate processing unit 12, and the compressor 13 are provided on each of the Lch side and the Rch side independently of each other.

In the above descriptions, the speakers 1S and 2S are of the BA type, but speakers of a dynamic type or a capacitor type may be used instead.

The internal microphones 1B and 2B and the external microphones 1C and 2C are not particularly limited to certain types, either.

The present technique can also be embodied in the following structures.

(1) An earhole-wearable sound collection device including:

an attachment unit that is designed so that at least part of the attachment unit can be inserted into an earhole portion, and is designed to form a substantially sealed internal space therein when attached to the earhole portion, the internal space connecting to an ear canal;

an internal microphone that is located in the internal space of the attachment unit, and collects emitted speech voice that is emitted by a wearer and propagates through the ear canal when the attachment unit is attached to the earhole portion;

an equalizing unit that performs an equalizing process of a high-frequency emphasizing type on a sound collection signal from the internal microphone;

a speaker located in the internal space of the attachment unit; and a noise cancelling unit that causes the speaker to output noise cancelling sound based on a sound collection signal from a microphone provided for the attachment unit, the noise cancelling sound being output to reduce noise that propagates in the internal space of the attachment unit.

(2) The earhole-wearable sound collection device of (1), wherein the noise cancelling unit generates a noise cancelling signal compatible with a feedforward method based on a sound collection signal from an external microphone provided to collect sound outside the attachment unit, and causes the speaker to output the noise cancelling sound based on the noise cancelling signal.

(3) The earhole-wearable sound collection device of (1), wherein the noise cancelling unit generates a noise cancelling signal compatible with a feedback method based on a sound collection signal from a microphone provided to collect sound inside the internal space of the attachment unit, and causes the speaker to output the noise cancelling sound based on the noise cancelling signal.

(4) The earhole-wearable sound collection device of (3), wherein the noise cancelling unit generates the noise cancelling signal compatible with the feedback method based on the sound collection signal from the internal microphone.

(5) The earhole-wearable sound collection device of (1), wherein the noise cancelling unit generates a noise cancelling signal compatible with a feedforward method based on a sound collection signal from an external microphone provided to collect sound outside the attachment unit, generates a noise cancelling signal compatible with a feedback method based on a sound collection signal from a microphone provided to collect sound inside the internal space of the attachment unit, and causes the speaker to output the noise cancelling sound based on the two noise cancelling signals.

(6) The earhole-wearable sound collection device of (1) to (5), wherein the attachment unit is a first attachment unit to be attached to one ear of the wearer, and a second attachment unit to be attached to the other ear of the wearer, the internal microphone and the speaker are provided as a first internal microphone and a first speaker in the internal space of the first attachment unit, the noise cancelling unit is a first noise cancelling unit that causes the first speaker to output first noise cancelling sound based on a sound collection signal from a microphone provided on the side of the first attachment unit, the first noise cancelling sound being output to reduce noise that propagates in the internal space of the first attachment unit, a second speaker is located in the internal space of the second attachment unit, and a second received speech voice output unit is provided to cause the second speaker to output sound based on a received speech signal.

(7) The earhole-wearable sound collection device of (6), further including a second noise cancelling unit that causes the second speaker to output second noise cancelling sound based on a sound collection signal from a microphone provided on the side of the second attachment unit, the second noise cancelling sound being output to reduce noise that propagates in the internal space of the second attachment unit.

(8) The earhole-wearable sound collection device of (1) to (7), further including:

a sound output unit that causes the speaker to output received speech voice based on an input received speech signal, and the noise cancelling sound from the noise cancelling unit; and a received speech voice removing unit that removes, from the sound collection signal from the internal microphone, the component of the received speech voice output from the speaker based on the received speech signal.

(9) The earhole-wearable sound collection device of (1) to (8), further including a control unit that controls switching between a telephone call mode and a listening mode, wherein, in the telephone call mode, only the noise cancelling sound from the noise cancelling unit is output from the speaker, and, in the listening mode, the noise cancelling sound from the noise cancelling unit and sound for listening based on an audio signal for listening that is input from outside are output from the speaker.

(10) The earhole-wearable sound collection device of (1), wherein the attachment unit is a first attachment unit to be attached to one ear of the wearer, and a second attachment unit to be attached to the other ear of the wearer, a first internal microphone and a first speaker are provided as the internal microphone and the speaker in the internal space of the first attachment unit, a second internal microphone and a second speaker are provided as the internal microphone and the speaker in the internal space of the second attachment unit, the noise cancelling unit is a first noise cancelling unit that causes the first speaker to output first noise cancelling sound based on a sound collection signal from a microphone provided on the side of the first attachment unit, and a second noise cancelling unit that causes the second speaker to output second noise cancelling sound based on a sound collection signal from a microphone provided on the side of the second attachment unit, the first noise cancelling sound being output to reduce noise that propagates in the internal space of the first attachment unit, the second noise cancelling sound being output to reduce noise that propagates in the internal space of the second attachment unit, and a beam forming unit is further provided to perform a beam forming process based on a sound collection signal from the first internal microphone and a sound collection signal from the second internal microphone.

(11) The earhole-wearable sound collection device of (1) to (10), wherein the equalizing unit and the noise cancelling unit are located inside the attachment unit.

(12) The earhole-wearable sound collection device of (1) to (11), further including a noise gate processing unit that performs a noise gate process on the sound collection signal from the internal microphone.

(13) The earhole-wearable sound collection device of (1) to (12), further including a compressor unit that performs a compressor process on the sound collection signal from the internal microphone.

(14) A signal processing device including:

an equalizing unit that performs an equalizing process of a high-frequency emphasizing type on a sound collection signal from an internal microphone, the internal microphone being located in an internal space of an attachment unit, at least part of the attachment unit being to be inserted to an earhole portion, the attachment unit forming a substantially sealed internal space therein when attached to the earhole portion, the internal space connecting to an ear canal, the internal microphone collecting speech voice emitted by a wearer when the attachment unit is attached to the earhole portion, the speech voice propagating through the ear canal; and a noise cancelling unit that causes a speaker to output noise cancelling sound based on a sound collection signal from a microphone provided for the attachment unit, the noise cancelling sound being output to reduce noise that propagates in the internal space of the attachment unit, the speaker being located in the internal space of the attachment unit.

REFERENCE SIGNS LIST

1, 2 Attachment unit
1A, 2A Earhole insertion portion

1B, 2B Internal microphone
1C, 2C External microphone
1S, 2S Speaker
1V, 2V Internal space
3, 20, 25, 30, 35 Signal processing device
10, 14, 21, 36 Microphone amplifier
11, 32 Equalizer
12 Noise gate processing unit
13 Compressor
15, 22 NC filter (FF type)
16, 17 Amplifier
20A Control unit
23, 24, 27, 39 Adder
26, 38 Echo canceller (or filter)
31, 37 NC filter (FB type)
40 Beam forming unit
50 External device

The invention claimed is:

1. An earhole-wearable sound collection device comprising:

an attachment unit having at least a portion to be inserted into an earhole portion, the attachment unit forming a substantially sealed internal space therein when attached to the earhole portion, the internal space connecting to an ear canal;

an internal microphone configured to collect emitted speech voice that is emitted by a wearer and propagates through the ear canal when the attachment unit is attached to the earhole portion, the internal microphone being located in the internal space of the attachment unit;

an equalizing unit configured to perform an equalizing process of a high-frequency emphasizing type on a sound collection signal from the internal microphone;

a speaker located in the internal space of the attachment unit; and a noise cancelling unit configured to cause the speaker to output noise cancelling sound based on a sound collection signal from a microphone provided for the attachment unit, the noise cancelling sound being output to reduce noise that propagates in the internal space of the attachment unit.

2. The earhole-wearable sound collection device according to claim 1, wherein the noise cancelling unit is further configured to:

generate a noise cancelling signal compatible with a feedforward method based on a sound collection signal from an external microphone provided to collect sound outside the attachment unit, and cause the speaker to output the noise cancelling sound based on the noise cancelling signal.

3. The earhole-wearable sound collection device according to claim 1, wherein the noise cancelling unit is further configured to:

generate a noise cancelling signal compatible with a feedback method based on a sound collection signal from a microphone provided to collect sound inside the internal space of the attachment unit, and cause the speaker to output the noise cancelling sound based on the noise cancelling signal.

4. The earhole-wearable sound collection device according to claim 3, wherein the noise cancelling unit is further configured to generate the noise cancelling signal compatible with the feedback method based on the sound collection signal from the internal microphone.

5. The earhole-wearable sound collection device according to claim 1, wherein the noise cancelling unit is further configured to:

generate a noise cancelling signal compatible with a feedforward method based on a sound collection signal from an external microphone provided to collect sound outside the attachment unit, generate a noise cancelling signal compatible with a feedback method based on a sound collection signal from a microphone provided to collect sound inside the internal space of the attachment unit, and cause the speaker to output the noise cancelling sound based on the two noise cancelling signals.

6. The earhole-wearable sound collection device according to claim 1, wherein:

the attachment unit is a first attachment unit to be attached to one ear of the wearer, and a second attachment unit to be attached to the other ear of the wearer, the internal microphone and the speaker are provided as a first internal microphone and a first speaker in the internal space of the first attachment unit, the noise cancelling unit is a first noise cancelling unit configured to cause the first speaker to output first noise cancelling sound based on a sound collection signal from a microphone provided on the side of the first attachment unit, the first noise cancelling sound being output to reduce noise that propagates in the internal space of the first attachment unit, a second speaker is located in the internal space of the second attachment unit, and a second received speech voice output unit is provided to cause the second speaker to output sound based on a received speech signal.

7. The earhole-wearable sound collection device according to claim 6, further comprising:

a second noise cancelling unit configured to cause the second speaker to output second noise cancelling sound based on a sound collection signal from a microphone provided on the side of the second attachment unit, the second noise cancelling sound being output to reduce noise that propagates in the internal space of the second attachment unit.

8. The earhole-wearable sound collection device according to claim 1, further comprising:

a sound output unit configured to cause the speaker to output received speech voice based on an input received speech signal, and the noise cancelling sound from the noise cancelling unit; and a received speech voice removing unit configured to remove, from the sound collection signal from the internal microphone, a component of the received speech voice output from the speaker based on the received speech signal.

9. The earhole-wearable sound collection device according to claim 1, further comprising:

a control unit configured to control switching between a telephone call mode and a listening mode, wherein, in the telephone call mode, only the noise cancelling sound from the noise cancelling unit is output from the speaker, and in the listening mode, the noise cancelling sound from the noise cancelling unit and sound for listening based on an audio signal for listening that is input from outside are output from the speaker.

10. The earhole-wearable sound collection device according to claim 1, wherein:

the attachment unit is a first attachment unit to be attached to one ear of the wearer, and a second attachment unit to be attached to the other ear of the wearer, a first internal microphone and a first speaker are provided as the internal microphone and the speaker in the internal space of the first attachment unit, a second internal microphone and a second speaker are provided as the internal microphone and the speaker in the internal space of the second attachment unit, the noise cancelling unit is a first noise cancelling unit configured to cause the first speaker to output first noise cancelling sound based on a sound collection signal from a microphone provided on the side of the first attachment unit, and a second noise cancelling unit configured to cause the second speaker to output second noise cancelling sound based on a sound collection signal from a microphone provided on the side of the second attachment unit, the first noise cancelling sound being output to reduce noise that propagates in the internal space of the first attachment unit, the second noise cancelling sound being output to reduce noise that propagates in the internal space of the second attachment unit, and a beam forming unit is provided to perform a beam forming process based on a sound collection signal from the first internal microphone and a sound collection signal from the second internal microphone.

11. The earhole-wearable sound collection device according to claim 1, wherein the equalizing unit and the noise cancelling unit are located inside the attachment unit.

12. The earhole-wearable sound collection device according to claim 1, further comprising:

a noise gate processing unit configured to perform a noise gate process on the sound collection signal from the internal microphone.

13. The earhole-wearable sound collection device according to claim 1, further comprising:

a compressor unit configured to perform a compressor process on the sound collection signal from the internal microphone.

14. A signal processing device comprising:

an equalizing unit configured to perform an equalizing process of a high-frequency emphasizing type on a sound collection signal from an internal microphone, the internal microphone being located in an internal space of an attachment unit, at least a portion of the attachment unit being to be inserted into an earhole portion, the attachment unit forming a substantially sealed internal space therein when attached to the earhole portion, the internal space connecting to an ear canal, the internal microphone collecting speech voice emitted by a wearer when the attachment unit is attached to the earhole portion, the speech voice propagating through the ear canal; and a noise cancelling unit configured to cause a speaker to output noise cancelling sound based on a sound collection signal from a microphone provided for the attachment unit, the noise cancelling sound being output to reduce noise that propagates in the internal space of the attachment unit, the speaker being located in the internal space of the attachment unit.

15. A sound collection method comprising:

a sound collecting and noise cancelling step of collecting speech voice that is emitted by a wearer when an attachment unit is attached to an earhole portion and propagates through an ear canal, the speech voice being collected by an internal microphone located in an internal space of the attachment unit designed to form the internal space therein when attached to the earhole portion, the attachment unit having at least a portion to be inserted into the earhole portion, the internal space being substantially sealed and connecting to the ear canal, and causing a speaker to output noise cancelling sound based on a sound collection signal from a microphone provided for the attachment unit, the noise cancelling sound being output to reduce noise that propagates in the internal space of the attachment unit, the speaker being located in the internal space of the attachment unit; and an equalizing step of performing an equalizing process of a high-frequency emphasizing type on a sound collection signal that is obtained from the internal microphone in the sound collecting and noise cancelling step.

* * * * *